United States Patent [19]

Takamatsu et al.

[11] Patent Number: 4,509,099
[45] Date of Patent: Apr. 2, 1985

[54] ELECTRONIC COMPONENT WITH PLURALITY OF TERMINALS THEREON

[75] Inventors: Toshiaki Takamatsu, Tenri; Fumiaki Funada, Yamatokoriyama; Shuhei Yasuda, Nara; Masataka Matsuura, Tenri, all of Japan

[73] Assignee: Sharp Kabushiki Kaisha, Osaka, Japan

[21] Appl. No.: 467,664

[22] Filed: Feb. 18, 1983

Related U.S. Application Data

[63] Continuation of Ser. No. 235,920, Feb. 19, 1981, abandoned.

[30] Foreign Application Priority Data

Feb. 19, 1980 [JP] Japan .................................. 55-20294

[51] Int. Cl.³ .............................................. H05K 1/14
[52] U.S. Cl. .................................... 361/413; 361/398; 339/17 LM; 339/61 M
[58] Field of Search ................ 174/68.5; 361/412, 413, 361/414, 398; 339/DIG. 3, 17 F, 17 LM, 17 M, 61 M

[56] References Cited

U.S. PATENT DOCUMENTS

| | | | |
|---|---|---|---|
| 3,629,787 | 12/1971 | Wilson | 361/398 |
| 3,934,959 | 1/1976 | Gillison | 339/17 M |
| 3,951,493 | 4/1976 | Kozel | 339/17 M |
| 4,050,756 | 9/1977 | Moore | 361/413 |
| 4,201,435 | 5/1980 | Nakamura | 339/17 M |
| 4,249,302 | 2/1981 | Crepeau | 339/17 M |

*Primary Examiner*—G. P. Tolin
*Attorney, Agent, or Firm*—Birch, Stewart, Kolasch & Birch

[57] ABSTRACT

This invention is directed to an electronic component with a plurality of terminals thereon for liquid crystal display apparatus or the like. Since the construction is rendered smaller in size and the distributing sheet is rendered rigid in the contact position of the elastic conductor along the juxtaposing direction of the terminal pieces, the terminal pieces of the base plate can be electrically conducted, without failure the terminals through the elastic conductors.

2 Claims, 5 Drawing Figures

ELECTRONIC COMPONENT WITH PLURALITY OF TERMINALS THEREON

This application as a continuation, of copending application Ser. No. 235,920, filed on Feb. 19, 1981, and now abandoned.

The present invention relates to an electronic component with a plurality of terminals thereon for a liquid crystal display apparatus or the like and, more particularly, to the construction of the terminals provided on an electronic component.

Various constructions for the terminals from electronic components are already used for liquid crystal display apparatus or the like. For instance, FIG. 1 shows an exploded perspective view of an electronic component with a plurality of terminals thereon in a conventional structure. In the liquid crystal display apparatus or the like, a plurality of terminal pieces 2 are juxtaposed, at intervals along the right and left directions of FIG. 1, on one surface of the rigid base plate 1. To individually connect the terminal pieces 2 with a plurality of terminals 4 of the distributing sheet 3, an interposing member 5 is disposed between the base plate 1 and the distributing sheet 3. To electrically connect the terminal pieces 2 of the base plate 1 with the terminals 4 of the distributing sheet 3 respectively, the interposing member 5 is provided with a plurality of conductors which are electrically conducted along the thickness direction, i.e., the vertical direction of FIG. 1. The conductors are insulated from each other at intervals along the juxtaposing direction, i.e., right and left directions of FIG. 1, of the terminal pieces 2. The interposing member 5 is supported by a support frame 6. A spring plate 7 of the holding type which is formed into approximately a U-shape in shaft right-angle section urges the base plate 1 and the distributing sheet 3 in the mutual approaching direction with the interposing member 5 and the support frame 6 being provided between the base plate and the distributing sheet. Although the prior art has a superior advantage in that the terminal pieces 2 are not required to be welded to the terminals 4 of the distributing sheet 3, the construction has a disadvantage of being larger.

Accordingly, one object of the present invention is to provide an electronic component with a plurality of terminals thereon for a liquid crystal display apparatus which can eliminate the disadvantages inherent in the conventional one as described hereinabove.

Another object of the present invention is to provide an electronic component wherein the terminals of the distributing sheet are electrically connected, under a small-size construction, to the terminal pieces of the base plate.

A further object of the present invention is to provide an electronic component of which the construction is rendered smaller in size and the distributing sheet is rendered rigid in the contact position of the elastic conductor along the juxtaposing direction of the terminal pieces, whereby the terminal pieces of the base plate can be electrically connected without fail to the terminals through the elastic conductors.

According to the present invention, there provides an electronic component with a plurality of terminals thereon having a plurality of terminal pieces juxtaposed and secured on one surface of a rigid base plate, comprising an interposing member provided with elastic conductors each extending in the thickness direction of each of the terminal pieces, corresponding to each of the terminal pieces, and adapted to retain the elastic conductors, mutually insulating the elastic conductors with one end portion along the thickness direction of each of the elastic conductors being in individual contact against each of said terminal pieces, a distributing sheet to be secured through the interposing member to said base plate, one surface on the side of the interposing member side of the distributing sheet being provided with flexible terminals juxtaposed along the juxtaposing direction of the terminal pieces respectively corresponding to the elastic conductors, the flexible terminals being in contact against the other end portions along the thickness of the elastic conductors, and the flexible terminals being rigid in the contact position along said juxtaposing direction between the flexible terminals and the elastic conductors and being flexible in the remaining portion.

These and other objects, features, aspects and advantages of the present invention will become more apparent from the following detailed description of the present invention when taken in conjunction with the accompanying drawings.

Figure 1:
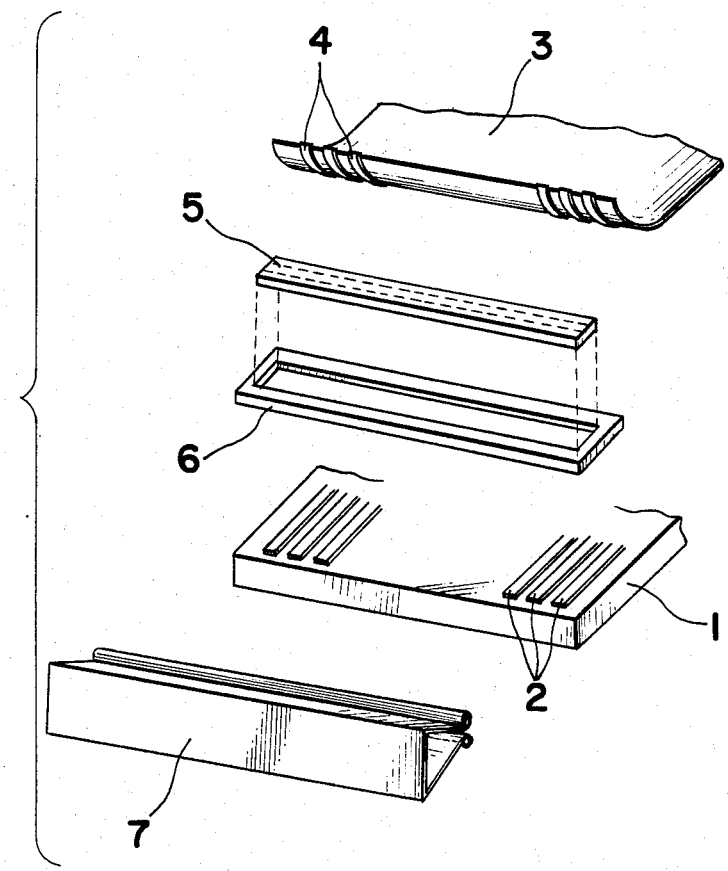
FIG. 1 is a simplified, exploded perspective view of an electronic component with a plurality of terminals thereon of conventional type as referred to hereinabove.
Figure 2:
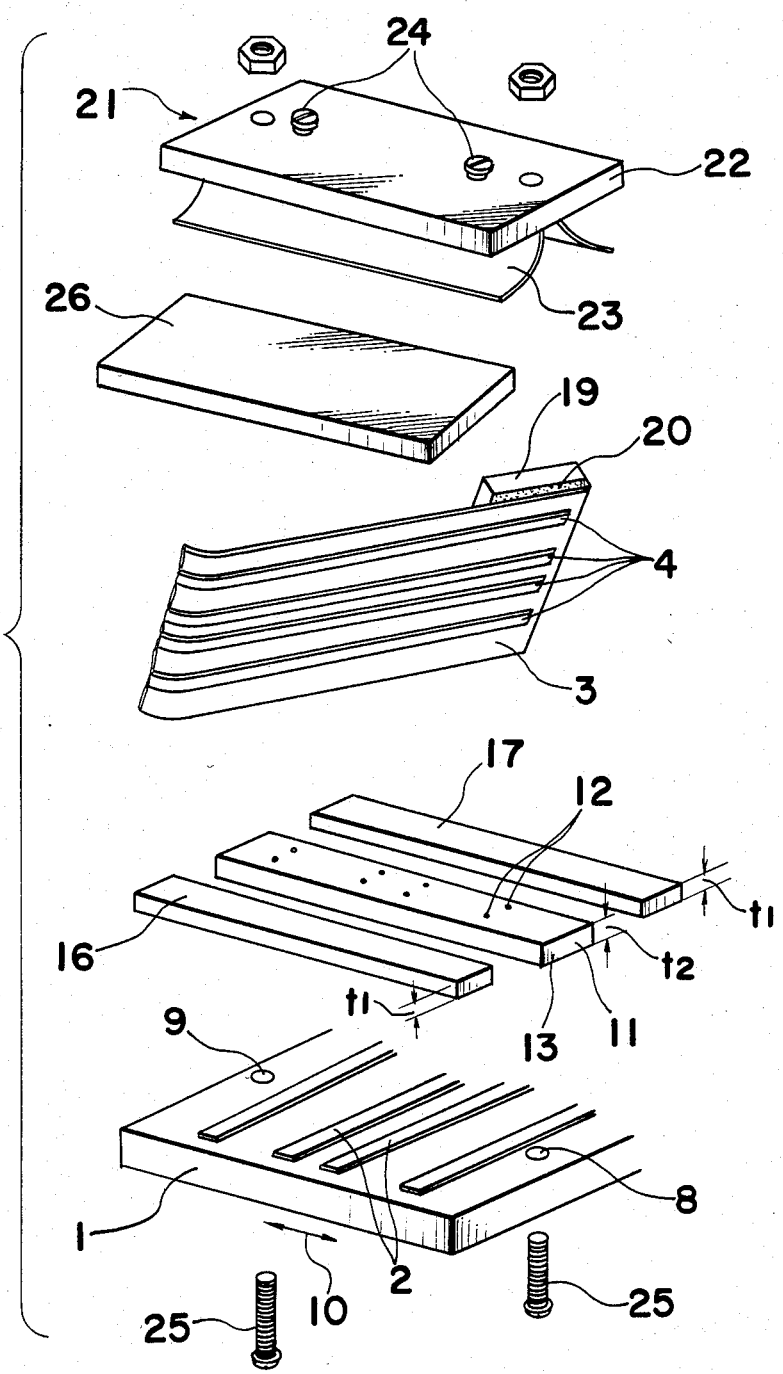
FIG. 2 is a simplified, exploded perspective view of an electronic components with a plurality of terminals thereon for a liquid crystal display apparatus in accordance with one embodiment of the present invention.
Figure 3:
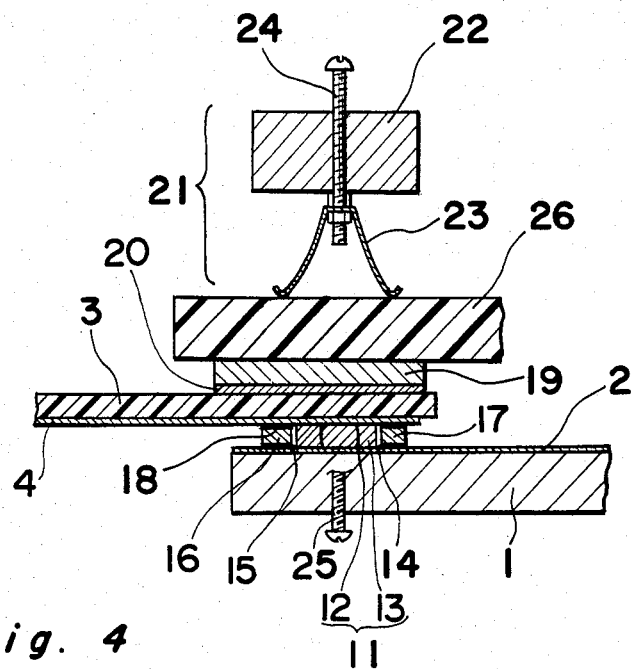
FIG. 3 is a cross-sectional view showing the assembling condition of the embodiment of FIG. 2.
Figure 4:
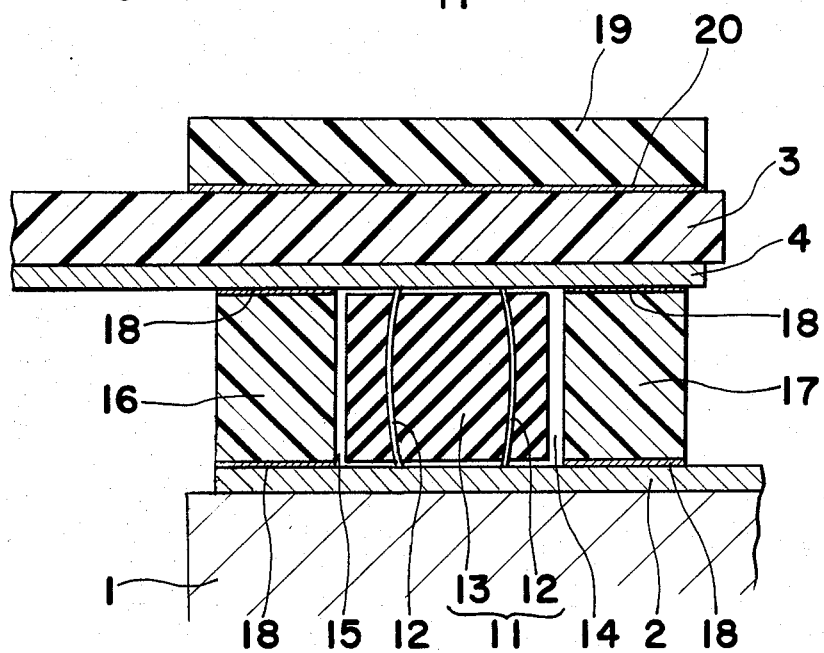
FIG. 4 is an enlarged cross-sectional view of a portion of the embodiment of FIG. 2.

Referring to FIG. 2, FIG. 3 and FIG. 4, a plurality of terminal pieces 2 are disposed, at intervals in side-by-side relation along the right and left direction of FIG. 2, on one surface of a base plate, composed of a rigid insulating material, of a liquid crystal display apparatus. These terminal pieces 2 are formed on the base plate 1. Mounting holes 8 and 9 are drilled in the end portions along the juxtaposing direction, which is the right and left direction of FIG. 2, and is vertical in direction with respect to the paper face of FIG. 3 or FIG. 4, of the terminal pieces 2. An interposing member 11 is provided, extending along the juxtaposing direction 10, on the base plate 1. The interposing member 11 is provided with electrically conducting elastic conductors 12 each extending in the thickness direction, which is the vertical direction of FIG. 2 and FIG. 3, of the terminal piece 2. Each of the elastic conductors 12, which is a rod-shaped body made of such as Au-plated stainless steel, extends along the thickness direction of the interposing member 11. The elastic conductor 12 is elastically deformed when the pressing force is applied in the thickness direction of the interposing member 11. The elastic conductor 12 is retained by an insulating elastic material such as silicon rubber 13. In this embodiment, the elastic conductor 12 is disposed, as pairs, in an interval along the extending right and left of FIG. 3 and FIG. 4 of the terminal pieces 2. One end portion, i.e., the lower end portion of FIG. 2 through FIG. 4, along the thickness direction of the elastic conductor 12 is electrically conducted in contact against the terminal piece 2.

Terminals 4 are formed on the surface, on the terminal side of the base plate 1, of a distributing sheet 3 composed of a flexible insulating material. The terminals 4 are flexible, and correspond, respectively, to the terminal pieces 2. The other end portions of the elastic conductors 12 are respectively in contact against the terminals 4 for electrical conduction. The distributing sheet 3 may have the terminals 4 of 35 μm in thickness formed on the polyimide film of 1 mil (=25 μm) in thickness. Although the terminals 4 are required to be exposed at their end portions, which come into electric connection against the elastic conductors 12, the remaining portion may be covered and protected by another electric insulating film or the like.

Rigid spacers 16 and 17 are disposed, at intervals 14 and 15 (see FIG. 4), on the right and left sides of the interposing member 11 along the longitudinal direction of the terminal pieces 2. The spacers 16 and 17 may be polyimide laminated plate. These spacers 16 and 17 are bonded to the base plate 1 and the distributing sheet 3 with bonding agent 18. A rigid support plate 19 made of polyimide, glass epoxy or the like, each being 0.3 through 1.0 mm in thickness is adhered, with bonding agent 20, to the distributing sheet 3 on the face reverse to the face having the terminals 4 provided thereon. The distributing sheet 3 is rigid in the upper portion thereof covering the interposing member 11 and the spacers 16 and 17, and is flexible in the remaining portion thereof. The spacers 16 and 17 are equal in thickness t1, which is smaller (t1<t2) than the thickness t2 of the interposing member 11 under the natural condition where the depressing force is not applied. The support plate 19 may be a glass epoxy plate of such as 0.3 through 1.0 mm in thickness. The bonding agents 18 and 20 may be epoxy series bonding agent, such as "Cemedain CS2340-5", which is a registered trade name of commodity product owned by Cemedain Co., Ltd. in Japan. Also the interposing material may be a substance such as "Elastic Connector" which is a registered trade name of commodity product owned and sold by Toray Industries Inc. in Japan. In the commodity, the t2 of spacers is set at about 0.5 mm.

In assembling the liquid crystal display apparatus of the present invention, the distributing sheet 3 with the support plate 19 bonded thereto with the bonding agent 20 is provided, and the spacers 16 and 17 are engaged on the base plate 1 with the bonding agent 18. Then, the interposing member 11 is disposed between the spacers 16 and 17. Since the spaces 14 and 15 are disposed, the interposing member 11 may elastically collapse when the member has been depressed in the thickness direction. Thereafter, the terminals 2 of the base plate 1 are correctly aligned in position with the terminals 4 of the distributing sheet 3 to allow the mutual electric conduction therebetween. Thus, the distributing sheet 3 is secured to the spacers 16 and 17, through the bonding agent 18, with the use of a jig.

The jig 21 is composed of a rigid plate-shaped body 22, with which a downwardly spread spring 23 is engaged by bolts 24. The bolts 24 advance or retreat along the thickness direction of the body 22 to advance or retreat the spring 23 from the body 22. The body 22 is supported on the base plate 1 with mounting bolts 25, which extend through the mounting holes 8 and 9 of the base plate 1. The distributing sheet 3 is elastically urged towards the base plate 1, by the spring 23, through a depressing cap glass plate 26. After the bonding agents 18 and 20 have hardened, the jig 21 and the mounting bolt 25 are removed. In this manner, the terminal pieces 2 on the base plate 1 come into elastic contact against the terminals 4 of the distributing sheet 3 through the elastic conductors 12 for the electric conduction.

According to the experiments of the present inventors, the results of Table 1 have been provided through the experiments of eight specimens on the production of the inferior conduction in a case where the commodity name "Elastic Connector" produced by the Toray Industries Inc. of Japan is used as the interposing member 11, and the terminal pieces 2 and the terminals 4 are respectively 160 in number in the embodiment having the above-described construction. It has been confirmed that inferior conduction hardly ever occurs.

TABLE 1

| | Specimen Numerals | | | | | | | |
|---|---|---|---|---|---|---|---|---|
| | 1 | 2 | 3 | 4 | 5 | 6 | 7 | 8 |
| Number of Electrodes of Inferior Conduction Produced | 0 | 0 | 0 | 0 | 1 | 0 | 0 | 0 |

Figure 5:
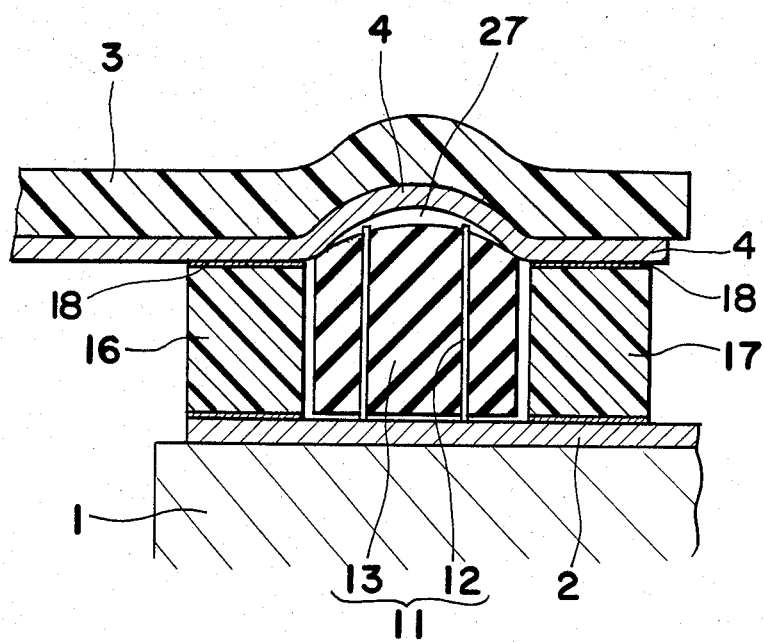
FIG. 5 is a cross-sectional view similar to FIG. 4 showing a comparison example with the embodiment of the present invention.

The inferior conduction produced in Table 2 is as follows when the experiments, similar to those of the above description, have been performed in connection with the construction of FIG. 5, wherein the distributing sheet 3 has no support plate 19, for comparison purposes.

TABLE 2

| | Specimen Numerals | | | | | | | |
|---|---|---|---|---|---|---|---|---|
| | 9 | 10 | 11 | 12 | 13 | 14 | 15 | 16 |
| Number of Electrodes of Inferior Conduction Produced | 32 | 41 | 14 | 31 | 19 | 30 | 6 | 25 |

The inventors of the present case have studied the causes of the referred results reported in Table 2. In the comparison example of FIG. 5, the distributing sheet 3 rises upwardly in FIG. 5 due to the elastic force of the interposing member 11 between the spacers 16 and 17. As a result, a gap 26 is formed among the elastic conductor 12, the terminal pieces 2 and the terminals 4. The gap 26 causes the inferior conduction due to non-contact of the elastic conductor 12 against the terminal pieces 2 or the terminals 4.

In the above-described embodiment, although the distributing sheet 3 has been rendered rigid by the support plate 19, a distributing sheet having larger thickness and rigidity partially in the position of the interposing member 11 may be used in the other embodiment of the present invention. Although the elastic semiconductor 12 was the stainless steel rod-shaped body in the above-described embodiment, the elastic semiconductor may be carbon fiber or metallic particles in the other embodiment.

According to the present invention, since the construction is rendered smaller in size and the distributing sheet is rendered rigid in the contact position of the elastic conductor along the juxtaposing direction of the terminal pieces, the terminal pieces of the base plate can be electrically connected without fail to the terminals through the elastic conductors.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An electronic component with a plurality of terminals thereon comprising in combination a rigid base plate having a plurality of terminal pieces juxtapositioned thereon next to each other and secured on one surface of said base plate, an interposing member provided with elastic flexible conductors having first and second end portions, each conductor extending in the thickness direction through said interposing member substantially perpendicular and corresponding to each of said terminal pieces, said interposing member adapted to retain said elastic conductors mutually insulated one from the other, said first end portions along the thickness direction of each of said elastic conductors being in individual contact with each of said terminal pieces on said base plate, a distributing sheet secured by way of said interposing member to an end portion of said base plate, the surface of said distributing sheet facing said interposing member being provided with a plurality of flexible terminals thereon in electrical contact with said second end portions of said elastic conductors, said flexible terminals being in electrical connection with said terminal pieces on said base plate along the thickness of said elastic conductors, a rigid support plate having a flat face superimposed and bonded over its entire surface to an end portion of said distributing sheet corresponding to said end portion of said base plate, said flexible terminals being held rigid therebetween in contact with said elastic conductors by said rigid support plate, so as to maintain electrical contact at all times between said elastic conductors and said terminals.

2. The electric component of claim 1, further including spacer means juxtapositioned and bonded to said base plate on either side of said interposing member so as to further support said terminals.

* * * * *